(12) United States Patent
Sventek et al.

(10) Patent No.: US 6,638,144 B2
(45) Date of Patent: Oct. 28, 2003

(54) METHOD OF CLEANING GLASS

(75) Inventors: Bruce A. Sventek, St. Paul, MN (US); Craig F. Lamphere, Woodbury, MN (US); Timothy L. Graf, Lake Elmo, MN (US); John L. Barry, Stacy, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 269 days.

(21) Appl. No.: 09/817,850

(22) Filed: Mar. 26, 2001

(65) Prior Publication Data

US 2001/0051494 A1 Dec. 13, 2001

Related U.S. Application Data

(60) Provisional application No. 60/200,608, filed on Apr. 28, 2000.

(51) Int. Cl.$^7$ .................................................. B24B 1/00
(52) U.S. Cl. .............................. 451/41; 451/36; 451/53; 451/59
(58) Field of Search .............................. 457/41, 36, 53, 457/63, 59

(56) References Cited

U.S. PATENT DOCUMENTS

| | | | |
|---|---|---|---|
| 1,373,532 A | 4/1921 | Showers | |
| 2,936,555 A | 5/1960 | Junge | |
| 3,594,865 A | 7/1971 | Erb | |
| 4,106,915 A | 8/1978 | Kagawa et al. | |
| 4,529,410 A | 7/1985 | Khaladji et al. | |
| 4,959,265 A | 9/1990 | Wood et al. | |
| 5,077,870 A | 1/1992 | Melbye et al. | |
| 5,137,541 A * | 8/1992 | Foster ......................... | 51/293 |
| 5,152,917 A | 10/1992 | Peiper et al. | |
| 5,435,816 A | 7/1995 | Spurgeon et al. | |
| 5,569,063 A | 10/1996 | Morioka et al. | |
| 5,632,668 A | 5/1997 | Lindholm et al. | |
| 5,667,541 A | 9/1997 | Klum et al. | |
| 5,867,268 A | 2/1999 | Gelikonov et al. | |
| 5,876,268 A | 3/1999 | Lamphere et al. | |
| 5,885,142 A | 3/1999 | Yoshida | |
| 5,958,794 A | 9/1999 | Bruxvoort et al. | |
| 5,989,111 A | 11/1999 | Lamphere et al. | |
| 6,159,551 A * | 12/2000 | Yeiser et al. ................. | 427/426 |
| 6,474,104 B1 * | 11/2002 | Campbell et al. ............ | 65/60.1 |

FOREIGN PATENT DOCUMENTS

EP         0 366 051        2/1990

OTHER PUBLICATIONS

Cook Lee M. "Chemical Processes in Glass Polishing" Journal of Non–Crystalline Solids 120 (1990) pp. 152–171.

* cited by examiner

Primary Examiner—Eileen P. Morgan
(74) Attorney, Agent, or Firm—Daniel R. Pastirik; Dean M. Harts

(57) ABSTRACT

A method of polishing and cleaning a glass surface with a single abrasive article. The abrasive article includes ceria abrasive particles dispersed in binder, the abrasive article having a textured, three-dimensional abrasive coating. The method includes contacting the glass surface with the abrasive article at a desired pressure and in the presence of water, and moving the abrasive article and glass in relation to each other under pressure. The water is believed to mediate a chemical reaction involving the ceria and the glass, thereby leaving a haze on the glass surface. With continued motion of the abrasive article in relation to the glass workpiece, without the addition of additional water, the haze is removed.

24 Claims, 2 Drawing Sheets

METHOD OF CLEANING GLASS

Priority under 35 U.S.C. §119(e) is claimed to provisional application Ser. No. 60/200,608, filed on Apr. 28, 2000, and entitled "Method of Cleaning Glass". The complete disclosure of application 60/200,608 is incorporated by reference herein.

FIELD

The present disclosure relates to a method for rapidly cleaning a glass workpiece surface using a fixed abrasive article including cerium oxide particles dispersed in a binder.

BACKGROUND

Glass articles are extensively found in homes, offices and factories in the form of lenses, prisms, mirrors, CRT tubes, flat display glass, vehicle windshields, computer disc substrates, windows, furniture glass, art glass and the like. The grinding, finishing and polishing of these types of glass objects to an optical clarity is of utmost importance. If present, defects, imperfections, and even minute scratches can inhibit the optical clarity of the glass article. Thus, it is desired that the glass be essentially free of any defects, imperfections, scratches and be optically clear. There are three main processes or steps for finishing glass: rough grinding, fining and polishing.

The rough grinding step generates any desired curve or radius in the glass with an abrasive tool. Typically this abrasive tool includes a super-hard abrasive particle such as a diamond, tungsten carbide or cubic boron nitride. The abrasive tool in this rough grinding process imparts course scratches into the glass surface such that the resulting glass surface is neither precise enough nor smooth enough to directly polish to an optically clear state.

The fining step refines the coarse scratches generated by the rough grinding process. In general, the fining process removes the deep scratches remaining after rough grinding and provides a substantially smooth, although not polished, surface. The fining process also results in sufficient removal of the coarse scratches so that the glass surface can be polished to an optically clear surface. If the fining process does not remove all the coarse scratches, then it can be extremely difficult for the polishing step to remove these scratches to generate an optically clear surface. There is at least one fining step, typically two or more fining steps, with each subsequent fining step using an abrasive article that contains a smaller or finer abrasive particle size than the previous step.

For glass surfaces such as CRT tube glass, this fining is typically done with abrasive slurries, although coated and lapping abrasive articles can be used.

The polishing step generates an optically clear surface on the glass article. In many instances, this polishing step is done with a loose abrasive slurry. Loose abrasive slurries typically use a plurality of very fine abrasive particles (that is, less than about 10 micrometers, usually less than about 1 micrometer) dispersed in a liquid medium such as water. The loose abrasive slurry may contain other additives such as dispersants, lubricants, defoamers and the like. Loose abrasive slurries are usually the preferred means to generate the final polish because of the ability of the loose abrasive slurries to remove essentially all the remaining scratches to generate an optically clear surface that is essentially free of any defects, imperfections and/or minute scratches.

Many attempts have been made to provide a fixed abrasive article that can polish glass to an optical quality surface. For example, U.S. Pat. No. 5,632,668 to Lindholm et al. discloses a method for polishing an optical quality surface, such as an ophthalmic lens, using abrasive composites without an abrasive slurry. Essentially all abrasive particles eroded from the abrasive composites are removed by water from the polishing interface. Erosion of abrasive particles from the abrasive composites brings a continuous supply of new abrasive particles into engagement with the surface being polished. Thus, polishing is substantially accomplished by the abrasive particles held in the binder, not the eroded abrasive particles.

U.S. Pat. No. 5,876,268 to Lamphere et al. discloses an abrasive article for reducing the surface roughness of a glass workpiece, such as a CRT screen, in a time period of less than about one minute. The abrasive article has ceria abrasive particles dispersed in a binder, which can be formed into precisely-shaped composites.

CRT face panels are currently ground and finished on large rotary hemispherical lappers, utilizing various types of abrasive slurries and pads. The final polishing step to provide optical clarity typically uses a ceria slurry on a segmented felt pad. The slurry is pumped on to the pad-glass panel interface.

Although loose abrasive slurries are widely used for polishing glass articles, many disadvantages are associated with the slurries and the various processes. These disadvantages include the inconvenience of handling the required large volume of the slurry, the required agitation to prevent settling of the abrasive particles and to assure a uniform concentration of abrasive particles at the polishing interface, and the need for additional equipment to prepare, handle, and also recover and recycle the loose abrasive slurry. Additionally, the slurry itself must be periodically analyzed to assure its quality and dispersion stability which requires additional costly man hours. Furthermore, pump heads, valves, feed lines, grinding laps, and other parts of the slurry supply equipment which contact the loose abrasive slurry eventually show undesirable wear. Further, during usage, the polishing operation is usually very untidy because the loose abrasive slurry, which is usually applied as a viscous liquid to a soft pad, splatters easily and is difficult to contain.

Much less technical industrial glass is polished offhand. This process typically utilizes a felt buff wheel mounted on a backstand grinder. A ceria-based slurry or compound polish is typically used in offhand polishing. Random scratches in the glass are often removed by offhand polishing using right angle grinders having felt pads with ceria slurries or compounds. As explained above, slurry-based polishing methods exhibit significant disadvantages.

Generally, after the polishing step, the glass is cleaned. This improves the subsequent steps, when coatings such as anti-glare, anti-static, and such are applied to the glass.

SUMMARY OF THE DISCLOSURE

The present disclosure is directed to a method of cleaning a polished glass workpiece to optical clarity using a fixed abrasive article in a semi-dry process. Generally, the process uses a textured, three-dimensional abrasive article to remove some surface scratches from a glass workpiece, such as a CRT screen, and remove any contaminants, such as oil, from the surface. The abrasive article is brought into contact with the glass surface at a desired pressure and in the presence of water, and the abrasive article and glass are moved in relation to each other under pressure. The water is believed to mediate a chemical reaction involving ceria abrasive particles and the glass, thereby leaving a haze on the glass surface. With continued motion of the abrasive article in relation to the glass workpiece, without the addition of additional water, the haze is removed.

It will be understood that the actual time necessary to polish and clean a glass workpiece will vary depending upon a number of factors, such as the polishing apparatus used, the area of the surface to be polished and cleaned, the contact pressure, and the amount of water initially present at the interface.

The textured abrasive article used in the method of the present disclosure has a backing and an abrasive coating attached to the backing, with the coating having ceria abrasive particles dispersed in a binder. In some embodiments, the abrasive coating is a plurality of abrasive composites. The binder can be formed by an addition polymerization mechanism, that is, a free-radical or cationic polymerization, of a binder precursor. Additionally, the binder precursor can be polymerized by exposure to radiant energy, along, if necessary, with an appropriate curing agent. Preferably, the binder precursor includes multi-functional acrylate resin(s), mono-functional acrylate resin(s) and mixtures thereof.

The abrasive composites can be precisely shaped or irregularly shaped. Preferably, the abrasive composites are precisely shaped. The textured, or three-dimensional abrasive article used for polishing and cleaning in accordance with this disclosure can be referred to as "structured" in the sense of the deployment of a plurality of such precisely-shaped abrasive composites. These abrasive composites, whether precisely or irregularly shaped, can be of any geometrical shape defined by a substantially distinct and discernible boundary, such as pyramidal, truncated pyramidal, and the like.

Specifically, in one aspect, the method of cleaning glass according to the present disclosure comprises contacting the glass surface with an abrasive article, which has a textured abrasive coating having a plurality of ceria abrasive particles dispersed in a binder; moving the abrasive article in relation to the glass surface in the presence of a liquid; and then moving the abrasive article in relation to the glass surface without the presence of a liquid.

In another aspect, the method of cleaning glass comprises contacting the glass surface with a textured surface of an abrasive article comprising a plurality of ceria abrasive particles dispersed in a binder such that at least a plurality of ceria surfaces are exposed; moving the abrasive article in relation to the glass surface in the presence of a liquid; allowing the liquid to substantially evaporate while continuing to move the abrasive article relative to and in contact with the glass surface; and then removing any debris formed during any of the previous steps.

BRIEF DESCRIPTION OF THE DRAWING

Other features, advantages, and further methods of practicing the disclosure will be better understood from the following description of figures and the preferred embodiments of the present disclosure.

DETAILED DESCRIPTION

Figure 1:
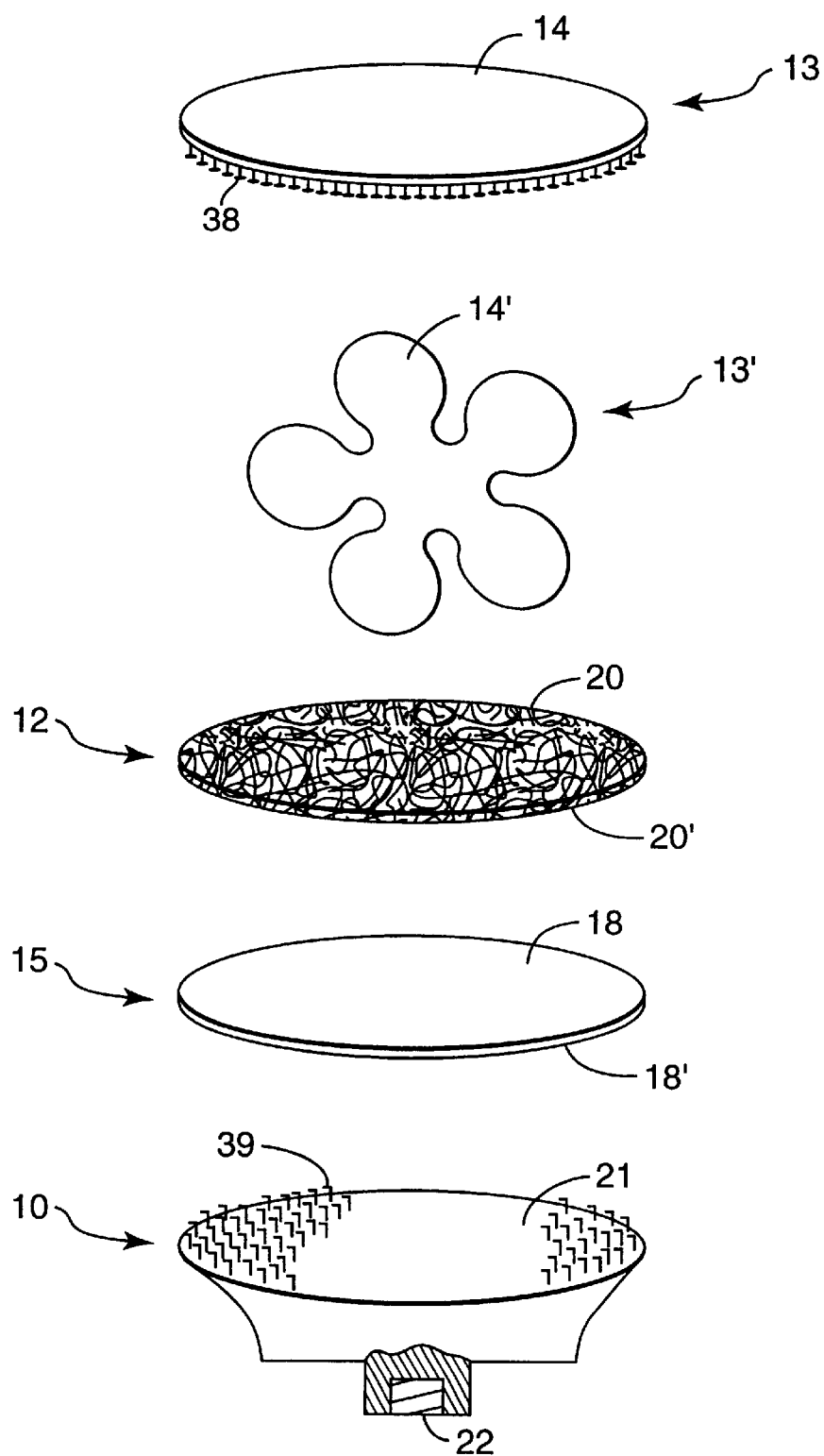
FIG. 1 is an exploded view of an assembly used for polishing glass in accordance with the present disclosure.

This disclosure relates to a method for cleaning a polished glass workpiece surface using a textured, or three-dimensional, abrasive article including cerium oxide (or ceria) particles dispersed in a binder. The cleaning of optical quality surfaces is important in producing acceptable surfaces on optical components such as lenses, prisms, mirrors, CRT tubes, windshields, windows, glass computer discs, glass photographic and picture frames and the like. Windows and windshields can be automotive windows, bus windows, trains or, windows, air craft windows, home windows, office windows and the like. Cleaning of the surfaces is important in order for the surface to accept and retain an acceptable finish coating on the glass. This coating can be a scratch-resistant coating, an anti-reflective coating, an anti-static coating, anti-glare coating, paint or a decorative coating. This coating will of course depend upon the end use of the glass and the demands of the consumer/end user of the finished product.

The method of the present disclosure combines the final polishing and cleaning steps into one step. In many embodiments, polishing steps are used for the removal of coarse surface scratches left by grinding or cutting operations. The polishing of the present method differs from those polishing steps in that the polishing of the present invention modifies the surface on a molecular level, removing very little glass.

In general, the combination polishing and cleaning of this invention involves contacting the glass surface with an abrasive article and moving one in relation to the other under a desired pressure. A small amount of liquid, such as a drip or spray of water, is provided at the glass-abrasive interface prior to, or soon after, bringing the two articles together. During use of the abrasive article, fresh ceria abrasive particles are exposed. In some embodiments, the liquid may dissolve or soften a portion of the abrasive article exposing fresh ceria abrasive particles. The exposed ceria abrasive particles interact with the glass surface, removing the silica on a molecular level. As the liquid evaporates, this silica is deposited onto the glass surface as a haze on the glass surface. Continued contact of the glass with the abrasive article, but without the addition of additional liquid, removes the haze and provides an optically acceptable finish.

The actual time needed for polishing and cleaning the glass workpiece depends on the size of the surface area to be polished, the pressure being used, initial surface finish of the glass workpiece, the abrasive particle size, the desired final surface finish of the glass workpiece, and the amount of lubricant (e.g., water) used.

Method of Polishing

The process of this disclosure involves a combination of moist and dry processing that results in a clean polished surface without the need for separate polishing and cleaning steps.

For purposes of the present disclosure, the term "polishing" means removing previous scratches to provide a fine, mirror-like finish without visually-identifiable scratches in the surface of the glass workpiece. This surface finish is needed to ensure that the glass surface is free of wild swirls and deep scratches which would impair the optical properties of the glass surface. For purposes of the present disclosure, the term "cleaning" means removing undesired contaminants from the glass surface. Examples of contaminants that are often present on the glass surface and that needed to be cleaned off include oils, grease, organic solvents, and the like. Removal of these contaminants is needed to ensure that any subsequent coating, such as a hard-coat, anti-static coating, and the like, will adhere to and evenly coat the glass surface.

The abrasive article used in the combination method of polishing-cleaning the glass surface has a three-dimensional abrasive coating with ceria (cerium oxide) abrasive particles dispersed in a binder. The abrasive coating is three dimensional, meaning it has work surfaces which do not form an integral layer; rather, portions of the abrasive coating are recessed from the polishing surface. The three-dimensional coating provides room for debris removal and provides room for fluid interaction between the abrasive and glass surface. The abrasive article is discussed in detail below.

The polishing-cleaning method can be done as an automated process, such as with a robotic grinder, or manually with a hand tool. In both embodiments, the method provides a polished and clean glass surface.

The combination polishing-cleaning process, although done as one process, can be divided into two steps: polishing and cleaning. During the polishing step, minute imperfections such as pits and scratches in the glass are removed. During the cleaning step, contaminants and any residue generated during the cleaning step are removed.

For the polishing step, the surface of the glass workpiece is contacted with the ceria abrasive article in the presence of a small amount of liquid. The liquid used is preferably water, such as tap water or deionized water, but in some embodiments it may be preferable to add organic ingredients, such as defoamers, lubricants, and the like to the water. In other embodiments, mineral oil and other lubricants may be preferred.

The amount of liquid provided will depend on the abrasive article, the glass area to be polished, the desired polishing time and other polishing process conditions. The amount of liquid should be sufficient to at least slightly dampen the interface between the glass and the abrasive article yet not flood the interface. In most embodiments, the liquid will be provided to the glass surface prior to contact with the abrasive article, typically as a spray or slow drip that does not continue throughout the polishing process. As mentioned above, in some embodiments the liquid softens the surface of the abrasive article, increasing the exposure of ceria abrasive particles.

It is the exposed ceria particles of the abrasive article that interact with the glass surface. It is believed that the exposed ceria abrasive particles may provide a chemo-mechanical element to the polishing procedure. As used herein, chemo-mechanical refers to a dual mechanism where corrosion chemistry and fracture mechanics both play a role in glass polishing. It is believed that ceria abrasive particles provide a chemical element to the polishing phenomenon as discussed in Cook, L. M., "Chemical Processes in Glass Polishing", 120 *Journal of Non-Crystalline Solids* 152–171, Elsevier Science Publ. B.V. (1990). It is further believed that the ceria particles mediate bond cleavage in the silica structure of the glass.

During the polishing-cleaning step, the abrasive article and glass workpiece are moved relative to one another. The interaction between the ceria abrasive particles and the glass surface is believed to be on a molecular level, it is believed no significant amounts of glass material are removed. Rather, the structure of the glass is modified on a microscopic level, smoothing the surface and removing minute scratches and pits. It is desired to have constant relative motion between the ceria and the glass surface, as a stagnant ceria particle may cause pitting in the glass. This can be a particular problem at the center point of a rotary grinder, where the velocity approaches zero. This problem can be avoided by providing constant movement of the abrasive article, typically by moving the article in sweeping motion. Another solution to the problem of the zero center velocity is to provide an annular abrasive article having no ceria particles present in the center.

As the liquid dries or evaporates, fine silica particles, removed from the glass surface on a microscopic level, deposit onto the glass surface. This leaves a white, semi-opaque haze on the glass. Typically, this haze will occur after a single pass of the abrasive over the glass. The haze will take longer to deposit if more liquid was present during the polishing step. A typical duration for a single pass on a CRT screen is approximately 20–30 seconds.

After the liquid has dried and the haze has formed, the process converts to a cleaning step. The haze, which was created by the interaction of the exposed ceria particles with the glass, is removed by the three-dimensional structure of the abrasive article. As the abrasive coating is passed over the hazy glass, the portions of the coating contacting the glass scrape the silica haze off of the glass surface. Recesses in the abrasive article collect the fine silica particles, where the particles are retained. In order for the silica haze to be removed, no liquid, which may mediate chemical interaction between the ceria particles and the glass, should be present at the abrasive-glass interface. Typically, the haze will be removed after one pass; in some situations, two passes may be needed. The overall cleaning procedure can be done in as little as about 8 seconds, typically about 20 to 60 seconds.

In order to maintain contact between the exposed ceria particles and the glass workpiece, as well as to optimize the collection of the fine silica particles by the recesses in the abrasive article, some degree of compressibility, flexibility or other resiliency is provided to the abrasive article. This compression may be provided by the grinding tool used, by being built into the abrasive article, such as a compressible backing, or by selecting a back-up pad having the desired durometer. Back-up pads are generally made from either rubber or foam, each of which has a range of available hardnesses. In another embodiment, a compressible layer may be provided between the back-up pad and the abrasive article. In some embodiments, the compressible layer may be integral with the abrasive article; that is, the compressible layer can be integral with, attached to, or be the backing on which the abrasive coating is adhered. A porous compressible layer can be beneficial for additionally collecting the fine silica particles and for providing air flow to cool the abrasive article or glass surface.

FIG. 1 illustrates various elements that can be used with the present invention. Two usable abrasive articles 13 and 13' are shown. Abrasive article 13, shown in a perspective view, has an abrasive surface 14 and hooks 38 on the surface opposite abrasive surface 14. Abrasive article 13', shown in a top plan view, has an abrasive surface 14'. Although not shown, hooks would be on the surface opposite the abrasive surface 14'.

A compressible pad 12 is provided which provides the desired flexibility to the abrasive article 13, 13' during polishing-cleaning. Compressible pad 12 can be made from a rubber, foam, or other material that provides some compression. An example is a lofty nonwoven material, such as available from Minnesota Mining and Manufacturing Company ("3M") under the trade designation "Scotchbrite Type T Pad".

An interface pad 15 can be provided to attach compressible pad 12 to engagement surface 21 of a back-up pad 10. An example of a pad useful as interface pad 15 is commercially available from 3M under the trade designation "Hook-It II".

A back-up pad 10 is used to support abrasive article 13, 13' on the grinder or machinery used. An example of a back-up pad is commercially available from 3M under the trade designation "Finesse-It" contact pad.

The above parts can be assembled in various manners. In a first embodiment, abrasive article 13, 13' is attached to interface pad 15. In some embodiments, abrasive article 13, 13' may have a pressure-sensitive adhesive attachment system, which can be used to secure it to interface pad 15. In other embodiments, hooks on abrasive article 13, 13' engage with first surface 18 of interface pad 15. Second surface 18' of interface pad 15 is attached to back-up pad 10 via engagement surface 21. If a "Hook-it II" interface pad is used, the black side of the pad is positioned and secured to engagement surface 21. Attachment system 22, such as an internal thread, is used to attach back-up pad 10 to a grinder. A typical grinding speed for such an assembly is about 1400 to 1800 rpm.

In another embodiment, abrasive article 13, 13' is attached to compressible pad 12. Hooks 38 on abrasive article 13 engage with first surface 20 of compressible pad 12. The use of a compressible pad, such as a nonwoven, can act as a buff against the glass. Second surface 20' of compressible pad 12 engages with hooks 39 on engagement surface 21 of back-up pad 10. A typical grinding speed for such an assembly is about 1000–1400 rpm.

A small amount of water is used at the initial contact between the abrasive article and the glass surface. After the initial water, the process preferably is run without the addition of additional water; this should remove all loose ceria and silica particles that may be on the glass surface.

The process is generally run with the abrasive article positioned flat, or substantially flat, against the glass surface.

After the glass workpiece is polished and cleaned, a coating can be applied over the surface of the glass workpiece to protect the finish. This coating can be a scratch-resistant coating, an anti-reflective coating, anti-glare coating, anti-static coating, paint or a decorative coating. This coating will of course depend upon the end use of the glass surface and the demands of the consumer/end user of the finished product.

Abrasive Article Used for Polishing

The textured abrasive article used for the polishing-cleaning of the glass, as described above, is called a "three-dimensional" abrasive article because it has a three-dimensional abrasive coating, generally formed by an array of individual abrasive composites each having abrasive particles dispersed in a binder system. It is preferred that the composites are three dimensional, have work surfaces which do not form part of an integral layer, so that portions of the abrasive coating are recessed from the polishing surface. These recesses provide room for debris removal and provide room for fluid interaction between the abrasive and glass workpiece surface.

The abrasive article used in this disclosure may be a so-called "structured abrasive article". A structured abrasive article means an abrasive article having a plurality of individual shaped composites, such as precisely-shaped composites, positioned on a backing, each composite comprising abrasive particles dispersed in a binder. Other examples of three-dimensional abrasive articles usable for the method of the present disclosure include: (1) "beaded-type abrasive articles" which have beads (generally spherical and usually hollow) of binder and abrasive particles; these beads are then bonded to a backing with a binder; (2) abrasive agglomerates bonded to a backing, where the abrasive agglomerates include abrasive particles bonded together with a first binder; these agglomerates are then bonded to a backing with a second binder; (3) an abrasive coating applied by rotogravure roll or other embossed roll; (4) an abrasive coating applied through screen to generate a pattern; and (5) an abrasive coating on a contoured or embossed backing or on the fibers of a nonwoven backing or substrate. These examples are not limiting to the types of three-dimensional abrasive articles that can be used for the method of the present disclosure; rather, the list provided is merely a sampling of abrasive articles that have a three-dimensional or textured coating. Various other methods to provide abrasive coatings having a texture can be used, and these abrasive articles can be used in the present cleaning method.

Figure 2:
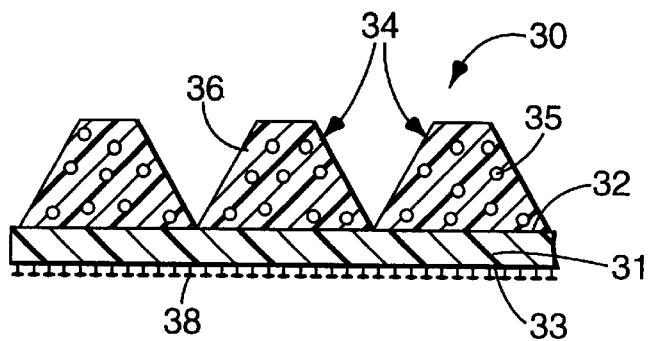
FIG. 2 is an enlarged cross-sectional view of one embodiment of an abrasive article for use with the method of the present disclosure.

Referring to FIG. 2, one embodiment of a three-dimensional abrasive article 30 is illustrated. Abrasive article 30 has a backing 31 having a plurality of individual abrasive composites 34 bonded to the front surface 32 of the backing and an attachment system, such as hooks 38 (of a hook and loop attachment system), on the back surface 33 of the backing. Hooks 38 are shown as nail-heads. Abrasive composites 34 include ceria abrasive particles 35 dispersed in a binder 36. Abrasive composites 34 have a precise shape, shown here as truncated pyramids.

Figure 3:
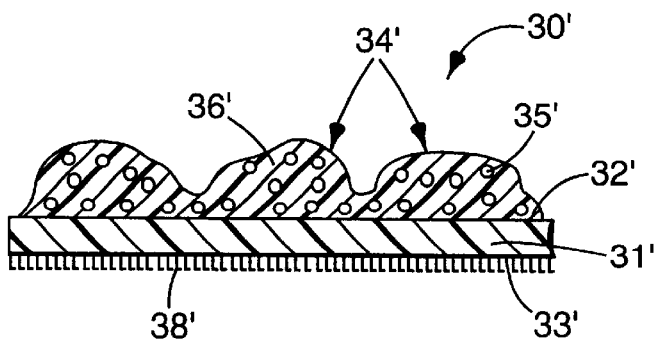
FIG. 3 is an enlarged cross-sectional view of an alternative embodiment of an abrasive article for use with the method of the present disclosure.

Referring to FIG. 3, a second embodiment of a three-dimensional abrasive article 30' used for cleaning glass is illustrated in detail. As shown, abrasive article 30' has a backing 31' having a plurality of individual abrasive composites 34' bonded to the front surface 32' of the backing and an attachment system, such as hooks 38' (of a hook and loop attachment system), on the back surface 33' of the backing. Hooks 38' are shown as hooks having a generally "j" shape; such hooks are available from 3M under the trade designation "Hook-It II". Abrasive composites 34' include ceria abrasive particles 35' dispersed in a binder 36'. Abrasive composites 34' have an imprecise or irregular shape, shown here as slumped composites. The irregular abrasive composites 34' are not bounded by well-defined shaped edges with distinct edge lengths having distinct endpoints.

The textured abrasive article used for cleaning the glass workpiece can have any backing used for abrasive articles, such as polymeric film (including primed polymeric film), cloth, paper, nonwovens (including lofty nonwovens) and treated versions thereof and combinations thereof Paper and cloth backings can have a water proofing treatment so that the backing does not appreciably degrade during the cleaning operation, as some water is used during cleaning.

The backing can have one half of an attachment system on its back surface to secure the abrasive article to the support pad or back-up pad. This attachment system half can be a pressure sensitive adhesive (PSA) or tape, a loop fabric for a hook and loop attachment, a hook structure for a hook and loop attachment, or an intermeshing attachment system.

The three-dimensional abrasive article can be any suitable shape, such as round, oval or rectangular depending on the particular shape of the lap pad (that is, the support pad) being employed. In many instances, the abrasive article will be slightly larger in size than the lap pad. An abrasive article may be slotted or slitted, or may be provided with perforations. The abrasive article may be an annulus. The sheet material also may be formed into an endless belt by conventional methods by splicing the abutted ends of an elongated strip of the sheet material. Additionally, the abrasive article may be die cut and/or slit to any desired configuration or shape.

The abrasive composites or coating of the abrasive article includes abrasive particles dispersed in a binder. The abrasive particles are preferably cerium oxide, or ceria, rare earth compounds, or mixtures thereof Such rare earth compounds suitable for polishing can be found in U.S. Pat. No. 4,529,410 (Khaladji et al.). It is believed that such abrasive particles may provide a chemo-mechanical element to the polishing procedure. As used herein, chemo-mechanical refers to a dual mechanism where corrosion chemistry and fracture mechanics both play a role in glass polishing. In particular, it is believed that abrasive particles such as cerium oxide and zirconium oxide, for example, provide a chemical element to the polishing phenomenon as discussed in Cook, L. M., "Chemical Processes in Glass Polishing", 120 *Journal of Non-Crystalline Solids* 152–171, Elsevier Science Publ. B.V. (1990).

The abrasive particles may be uniformly dispersed in the binder or alternatively the abrasive particles may be non-uniformly dispersed. It is preferred that the abrasive particles are uniformly dispersed so that the resulting abrasive coating provides consistent cutting/polishing.

For glass surface cleaning, the average size of the abrasive particles is at least about 0.001 micrometer; the average size is no greater than about 20 micrometers. Typically, the average size is about 0.01 to 10 micrometers. In some instances, the abrasive particles preferably have an average particle size less than 0.1 micrometer. In other instances, it is preferred that the particle size distribution results in no or relatively few abrasive particles that have a particle size greater than about 2 micrometers, preferably less than about 1 micrometer and more preferably less than about 0.75 micrometer. At these relatively small particle sizes, the abrasive particles may tend to aggregate by interparticle attraction forces. Thus, these aggregates may have a particle size greater than about 1 or 2 micrometers and even as high as 5 or 10 micrometers. It is then preferred to break up these aggregates to an average size of about 2 micrometers or less. In some instances, it is preferred that the particle size distribution be tightly controlled such that the resulting abrasive article provides a very consistent surface finish on the glass surface after polishing.

The abrasive article for use with this method may optionally include other abrasive particles in addition to cerium oxide. For example, the abrasive article can include cerium oxide particles and other rare earth oxides, such as zirconia, silica and the like. It is preferred that any optional abrasive particles do not hinder the cleaning properties of the cerium oxide by, for example, creating wild scratches.

To form an abrasive composite or coating, the abrasive particles are dispersed in a binder precursor. The binder precursor is cured or polymerized to form a binder. The abrasive particles are mixed with the binder precursor to form an abrasive slurry, which is then exposed to an energy source to aid in the initiation of the polymerization or curing process of the binder precursor. Examples of energy sources include thermal energy and radiant energy, which includes electron beam, ultraviolet light, and visible light.

Examples of suitable binder precursors which are curable via an addition (chain reaction) mechanism include binder precursors that polymerize via a free radical mechanism or, alternatively, via a cationic mechanism. These binder precursors include acrylated urethanes, acrylated epoxies, ethylenically unsaturated compounds including acrylate monomer resin(s), aminoplast derivatives having pendant $\alpha$, $\beta$-unsaturated carbonyl groups, isocyanurate derivatives having at least one pendant acrylate group, isocyanate derivatives having at least one pendant acrylate group, epoxy resins, vinyl ethers, and mixtures and combinations thereof. The term acrylate encompasses acrylates and methacrylates.

Various methods for producing abrasive articles having either precisely or irregularly shaped abrasive composites are taught, for example, in U.S. Pat. Nos. 5,152,917 (Pieper et al.), 5,435,816 (Spurgeon et al.), 5,667,541 (Klun et al.), 5,876,268 and 5,989,111 (Lamphere et al.), and 5,958,794 (Bruxvoort et al.), each of which is incorporated herein by reference.

Figure 4:
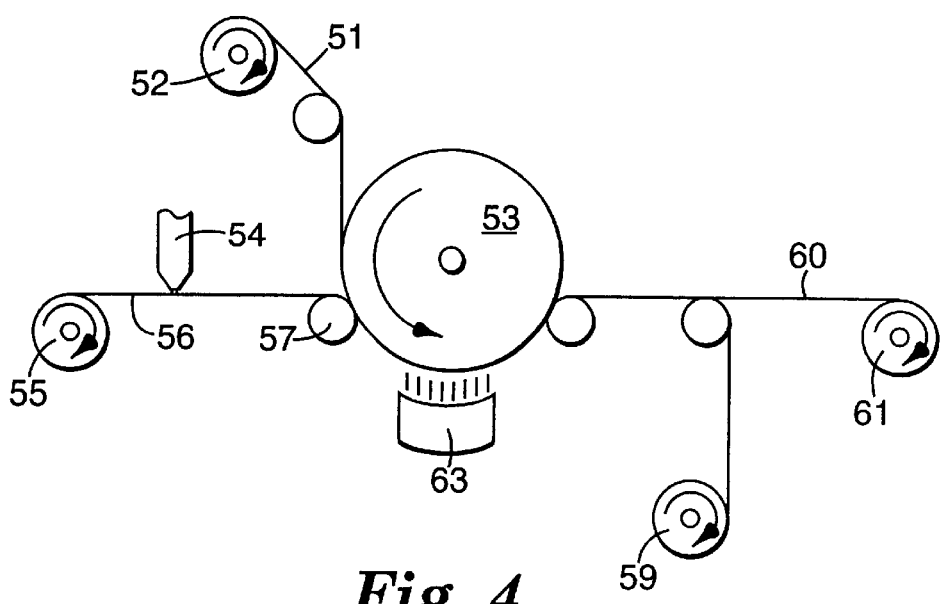
FIG. 4 is a schematic view of a system for making an abrasive article such as those depicted in FIGS. 2 and 3.

FIG. 4 is a schematic illustration of a method to manufacture an abrasive article having abrasive composites. The first step to making the abrasive article is to prepare the abrasive slurry, which is made by combining together by any suitable mixing technique the binder precursor, the abrasive particles and any optional additives. Examples of mixing techniques include low shear and high shear mixing, with high shear mixing being preferred. Pulling a vacuum during the mixing step can minimize the presence of air bubbles in the abrasive slurry. It is important that the abrasive slurry have a rheology that coats well and in which the abrasive particles and other additives do not settle out of the abrasive slurry. Any known techniques to improve the coatability, such as ultrasonic or thermal heating can be used.

To obtain an abrasive composite with a precise shape, the binder precursor is solidified or cured while the abrasive slurry is present in cavities of a production tool. To form an abrasive composite which has an irregular shape, the production tool is removed from the binder precursor prior to curing, resulting in a slumped, irregular shape.

A method of producing a three dimensional abrasive article is illustrated in FIG. 4. Backing 51 leaves an unwind station 52 and at the same time production tool (cavitied tool) 56 leaves an unwind station 55. Production tool 56 is coated with abrasive slurry by means of coating station 54. The coating station can be any conventional coater such as drop die coater, knife coater, curtain coater, vacuum die coater, or a die coater. During coating the formation of air bubbles should be minimized. One coating technique is a vacuum fluid bearing die, which can be of the type such as described in U.S. Pat. Nos. 3,594,865; 4,959,265 and 5,077,870.

After the production tool is coated, backing 51 and the abrasive slurry are brought into contact so that the abrasive slurry wets the front surface of the backing. In FIG. 4, the abrasive slurry is brought into contact with the backing by a contact nip roll 57. Next, contact nip roll 57 also forces the resulting construction against support drum 53. Next, some form of radiant energy is transmitted into the abrasive slurry by energy source 63 to at least partially cure the binder precursor. For example, the production tool can be transparent material (for example, polyester, polyethylene or polypropylene) to transmit light radiation to the slurry contained in the cavities in the tool as the tool and backing pass over roll 53. The term "partial cure" means that the binder precursor is polymerized to such a state that the abrasive slurry does not flow when the abrasive slurry is removed from the production tool. The binder precursor can be fully cured by any energy source after it is removed from the production tool. Following this, the production tool is rewound on mandrel 59 so that production tool 56 can be reused again. Additionally, abrasive article 60 is wound on mandrel 61. If the binder precursor is not fully cured, the binder precursor can then be fully cured by either time and/or exposure to an energy source.

In another variation of this first method, the abrasive slurry can be coated onto the backing and not into the cavities of the production tool. The abrasive slurry coated backing is then brought into contact with the production tool such that the abrasive slurry flows into the cavities of the production tool. The remaining steps to make the abrasive article are the same as detailed above.

Other details on the use of a production tool to make a three-dimensional abrasive article according to this method is further described in U.S. Pat. Nos. 5,152,917 (Pieper et al.) and 5,435,816 (Spurgeon et al.).

One example of a three-dimensional ceria abrasive article that is suitable for the combined polishing and cleaning of the present method is available from 3M under the trade designation "Trizact 568XA Cerium Oxide". This abrasive article has a three-dimensional structure with truncated pyramids about 914 micrometers tall, about 2030 micrometers wide at the base, and about 635 micrometers wide at the distal end.

This "Trizact 568XA Cerium Oxide" can be combined with a compressible pad available from 3M under the trade designation "Scotchbrite Type T", which has 6 denier polyester fibers at a weight of 0.32 g/cm$^2$, and a urethane and talc coating on the fibers at a weight of 0.48 g/cm$^2$. The overall thickness of the compressible pad is about 0.6 cm.

Another example of a three-dimensional ceria abrasive article that would be suitable is a lofty nonwoven, such as available from 3M under the trade designation "Scotchbrite", having a ceria abrasive coating provided on the fibers.

When the abrasive article is used in polishing of a glass surface, the abrasive coating gradually erodes. The erodibility rate depends upon many factors including the abrasive coating formulation and the polishing conditions. The abrasive coating formulation, the abrasive particle type, abrasive particle size, binder type, optional additives, individually or in combination with other, can affect the erodibility of the abrasive coating.

EXAMPLES

The following non-limiting Examples will further illustrate the invention. All parts, percentages, ratios, and the like are by weight unless otherwise indicated A cerium oxide polishing pad, commercially available from 3M under the trade designation "Trizact 568XA", supported on a nonwoven pad (commercially available from 3M under the trade designation "Scotchbrite Type T"), was affixed to a contact disk pad mounted on a hand-held rotary angle grinder. The contact disk pad was commercially available from 3M under the trade designation "Finess-It" contact disk, and the rotary angle grinder was a "Flex LW 603 VR" grinder (obtained from Ackermann & Schmitt of Steinheim/Murr, Germany).

The cerium oxide polishing pad was brought into contact with a 19 inch Sony CRT faceplate in the presence of a minimum amount of water necessary to wet the face of the CRT, (i.e., a puddle of water 2–3 inches in diameter). The pad was applied to the curved face of the CRT screen with pressure slightly in excess of that supplied by the weight of the tool itself, and was moved across the faceplate at approximately 10–30 feet per minute while maintaining essentially full contact between the glass and the pad. The abrasive article rotated at 2200 rpm. Following initial contact between the pad and the glass surface, a light haze formed as the water evaporated, and then the haze was removed by continued contact with the abrasive article. Total contact time was approximately 20 seconds. The glass surface was clean and dry at the conclusion of the process.

Substantially equivalent results were obtained with each of 5 inch and 8 inch abrasive article pads having either a circular shape or a daisy patter, which exposed areas of the underlying nonwoven pad. More consistent results were obtained using a robot grinding machine (a Fanuc 4520 JF 6 axis robot, available from Fanuc, Rochester Hills, Mich.). The robot operated at 3000 rpm, a travel speed of 1 meter/second, and a total contact time of 8 seconds. Residual moisture on the abrasive pad appeared to assist the retention of debris generated during the cleaning process. The debris was essentially completely removed during the cleaning process and the haze did not reform unless additional water was supplied. The surface at the conclusion of the cleaning process was clean, dry, conditioned, and ready for subsequent coating operations.

The complete disclosures of all patents, patent applications, and publications are incorporated herein by reference as if individually incorporated. Various modifications and alterations of this invention will become apparent to those skilled in the art without departing from the scope and spirit of this invention, and it should be understood that this invention is not to be unduly limited to the illustrative embodiments set forth herein.

We claim:

1. A method of cleaning a glass surface to provide optical clarity thereto, the method comprising:
   (a) contacting the glass surface with a textured surface of an abrasive article, the textured surface comprising a plurality of ceria abrasive particles dispersed in a binder and having recesses therein;
   (b) moving the abrasive article in relation to the glass surface in the presence of a liquid;
   (c) allowing the liquid to evaporate to form a haze consisting essentially of silica particles dispersed over the glass surface; and
   (d) moving the abrasive article in relation to the glass surface in the absence of the liquid to thereby remove the haze from the glass surface and retain the silica particles in the recesses of the textured surface.

2. The method according to claim 1, wherein the step of contacting the glass surface with the textured surface of an abrasive article comprises contacting the glass surface with a textured surface comprising a plurality of abrasive composites.

3. The method according to claim 2 wherein the abrasive composites are precisely shaped.

4. The method according to claim 2 wherein the abrasive composites are irregularly shaped.

5. The method according to claim 1, wherein the step of moving the abrasive article in relation to the glass surface in the presence of a liquid comprises exposing at least one ceria abrasive particle at the glass surface and moving the abrasive article in relation to the glass surface in the presence of a liquid.

6. The method according to claim 1 wherein the liquid comprises water.

7. The method according to claim 1 wherein the liquid is applied to the glass surface prior to contacting the glass surface with a textured surface of an abrasive article.

8. The method according to claim 7 wherein the liquid is sprayed onto the glass surface.

9. The method according to claim 1 wherein the abrasive article further comprises a compressible backing.

10. A method of cleaning a glass surface, the method comprising:
　(a) contacting the glass surface with a textured surface of an abrasive article, the textured surface comprising a plurality of ceria abrasive particles dispersed in a binder such that a plurality of ceria surfaces are exposed;
　(b) moving the abrasive article in relation to the glass surface in the presence of a liquid;
　(c) allowing the liquid to substantially evaporate to form a haze dispersed over the glass surface, the haze consisting essentially of silica particles;
　(d) continuing to move the abrasive article relative to and in contact with the glass surface; and
　(e) moving the abrasive article in relation to the glass surface in the absence of a liquid to remove the haze and provide an optically clear glass surface.

11. The method according to claim 10, wherein the step of contacting the glass surface with a textured surface of an abrasive article comprises contacting the glass surface with a textured surface comprising a plurality of abrasive composites.

12. The method according to claim 11 wherein the abrasive composites are precisely shaped.

13. The method according to claim 11 wherein the abrasive composites are irregularly shaped.

14. The method according to claim 10, wherein the liquid comprises water.

15. The method according to claim 10 wherein the liquid is applied to the glass surface prior to contacting the glass surface with a textured surface of the abrasive article.

16. The method according to claim 15 wherein the liquid is sprayed onto the glass surface.

17. The method according to claim 10 wherein the abrasive article further comprises a compressible backing.

18. A method of cleaning a glass surface, comprising:
　(a) contacting a ground glass surface with a textured surface of an abrasive article, the textured surface comprising a plurality of abrasive composites and recesses between the abrasive composites;
　(b) forming a haze on the glass surface by moving the abrasive composites in relation to the glass surface in the presence of a liquid, the haze consisting essentially of silicon oxide; and
　(c) removing the silicon oxide from the glass surface by moving the abrasive composites in relation to the glass surface in the absence of a liquid and retaining the silicon oxide within the recesses of the textured surface.

19. The method according to claim 18 wherein the abrasive composites are precisely shaped.

20. The method according to claim 18 wherein the abrasive composites are irregularly shaped.

21. The method according to claim 18, wherein the liquid comprises water.

22. The method according to claim 18 wherein the liquid is applied to the glass surface prior to contacting the glass surface with a textured surface of an abrasive article.

23. The method according to claim 22 wherein the liquid is sprayed onto the glass surface.

24. The method according to claim 18 wherein the abrasive article further comprises a compressible backing.

* * * * *

UNITED STATES PATENT AND TRADEMARK OFFICE
CERTIFICATE OF CORRECTION

PATENT NO. : 6,638,144 B2
DATED : October 28, 2003
INVENTOR(S) : Sventek, Bruce A.

It is certified that error appears in the above-identified patent and that said Letters Patent is hereby corrected as shown below:

Column 1,
Line 32, delete "course" and insert in place thereof -- coarse --.

Column 4,
Line 14, delete "trains or, windows," and insert in place thereof -- train windows --.

Column 7,
Line 23, delete "black" and insert in place thereof -- back --.

Column 8,
Line 55, insert -- . -- following "thereof".

Column 9,
Line 13, insert -- . -- following "thereof".

Column 11,
Line 47, insert -- each -- preceding "other".

Signed and Sealed this

First Day of June, 2004

JON W. DUDAS
*Acting Director of the United States Patent and Trademark Office*